US010032635B2

(12) United States Patent
Carpick et al.

(10) Patent No.: US 10,032,635 B2
(45) Date of Patent: Jul. 24, 2018

(54) THIN FILM METAL SILICIDES AND METHODS FOR FORMATION

(71) Applicant: THE TRUSTEES OF THE UNIVERSITY OF PENNSYLVANIA, Philadelphia, PA (US)

(72) Inventors: Robert W. Carpick, Philadelphia, PA (US); Frank Streller, Philadelphia, PA (US); Rahul Agarwal, Philadelphia, PA (US); Filippo Mangolini, Ecullly (FR)

(73) Assignee: THE TRUSTEES OF THE UNIVERSITY OF PENNSYLVANIA, Philadelphia, PA (US)

( * ) Notice: Subject to any disclaimer, the term of this patent is extended or adjusted under 35 U.S.C. 154(b) by 0 days.

(21) Appl. No.: 15/007,867

(22) Filed: Jan. 27, 2016

(65) Prior Publication Data
US 2016/0233097 A1    Aug. 11, 2016

Related U.S. Application Data

(60) Provisional application No. 62/112,579, filed on Feb. 5, 2015.

(51) Int. Cl.
*H01L 21/4763*   (2006.01)
*H01L 21/285*    (2006.01)
(Continued)

(52) U.S. Cl.
CPC ...... *H01L 21/28518* (2013.01); *B81B 3/0086* (2013.01); *B81C 1/00698* (2013.01);
(Continued)

(58) Field of Classification Search
CPC ............... H01L 27/016; H01L 29/456; H01L 21/28518; H01L 29/4908
(Continued)

(56) References Cited

U.S. PATENT DOCUMENTS

| 8,470,628 B2 * | 6/2013 | Guillorn | H01H 1/0094 257/414 |
| 2013/0050166 A1 * | 2/2013 | Hong | G01L 9/0042 345/211 |

(Continued)

OTHER PUBLICATIONS

Barth et al., "Engineering atomic and molecular nanostructures at surfaces," *Nature* 437, 671-679 (2005).
(Continued)

*Primary Examiner* — S. V. Clark
(74) *Attorney, Agent, or Firm* — Baker Botts L.L.P.

(57) ABSTRACT

The disclosed subject matter provides thin films including a metal silicide and methods for forming such films. The disclosed subject matter can provide techniques for tailoring the electronic structure of metal thin films to produce desirable properties. In example embodiments, the metal silicide can comprise a platinum silicide, such as for example, PtSi, $Pt_2Si$, or $Pt_3Si$. For example, the disclosed subject matter provides methods which include identifying a desired phase of a metal silicide, providing a substrate, depositing at least two film layers on the substrate which include a first layer including amorphous silicon and a second layer including metal contacting the first layer, and annealing the two film layers to form a metal silicide. Methods can be at least one of a source-limited method and a kinetically-limited method. The film layers can be deposited on the substrate using techniques known in the art including, for example, sputter depositing.

38 Claims, 12 Drawing Sheets

(51) Int. Cl.
B81C 1/00 (2006.01)
B81B 3/00 (2006.01)
H01L 29/45 (2006.01)
C01B 33/06 (2006.01)
H01L 29/84 (2006.01)

(52) U.S. Cl.
CPC ............ C01B 33/06 (2013.01); H01L 29/456 (2013.01); *B81B 2201/01* (2013.01); *B81B 2203/04* (2013.01); *B81C 2201/0181* (2013.01); *H01L 29/84* (2013.01)

(58) Field of Classification Search
USPC ........ 438/649, 653, 655, 656, 664, 682, 683
See application file for complete search history.

(56) References Cited

U.S. PATENT DOCUMENTS

2013/0127023 A1* 5/2013 Zenasni ............... C23C 16/56
257/635
2015/0008540 A1* 1/2015 Chu .................... B81C 1/00238
257/415

OTHER PUBLICATIONS

Chen, "Metal Silicides: An Integral Part of Microelectronics," *JOM* 57, 24-31 (2005).
Chou et al., "Volume and Grain Boundary Diffusion in L12 Alloys with Special Reference to Ni3Al Compounds," *Mat. Res. Soc. Symp. Proc.* 39, 461-474 (1985).
Chou et al., "In-situ TEM observation of Repeating Events of Nucleation in Epitaxial Growth of Nano CoSi2 in Nanowires of Si," *Nano Letters* 8(8), 2194-2199 (2008).
Coffa et al., "Determination of diffusion mechanisms in amorphous silicon," *Physical Review B* 45(15), 8355-8358 (1992).
De Boor et al., "Microstructural effects on thermoelectric efficiency: A case study on magnesium silicide," *Acta Materialia* 77, 68-75 (2014).
Fedorov, "Thermoelectric Silicides: Past, Present and Future," *Journal of Thermoelectricity* 2, 51-60 (2009).
Itoh et al., "Synthesis of Thermoelectric Manganese Silicide by Mechanical Alloying and Pulse Discharge Sintering," *Journal of Electronic Materials* 38(7), 925-929 (2009).
Janowski et al., "The Microstructure of Electrodeposited Titanium Aluminum Alloys," *Metallurgical Transactions A* 23, 2715-2723 (1992).
Kobayashi et al., "Nucleation of in situ Phosphorous-Doped Amorphous Silicon Films Deposited by Pyrolysis of Si2H6 and PH3," *Journal of The Electrochemical Society* 141(5), 1365-1369 (1994).
Lamber et al., "On the reaction of Pt with SiO2 substrates: Observation of the Pt3Si phase with the Cu3Au superstructure," J. Appl. Phys. 70(1), 457-461 (1991).
Lerch et al., "Diffusion of Platinum into Dislocated and Non-Dislocated Silicon," *Semiconductor Science and Technology* 10, 1257-1263 (1995).
Li et al., Silicon-based Nanomaterials (Springer, 2013).
Lin et al., "Growth of Nickel Silicides in Si and Si/SiOx Core/Shell Nanowires," *Nano Letters* 10, 4721-4726 (2010).
Liu et al., "In situ atomic-scale imaging of electrochemical lithiation in silicon," *Nature Nanotechnology* 7, 749-756 (2012).
Loh et al., "Nanoelectromechanical contact switches," Nature Nanotechnology 7, 283-295 (2012).
Mangolini et al., "Angle-resolved Environmental X-ray Photoelectron Spectroscopy: A New Laboratory Setup for Photoemission Studies at Pressures up to 0.4 Torr," *Review of Scientific Instruments* 83(9), 093112 (2012).
Mangolini, "Chemical Reactivity of Triphenyl Phosphorothionate (TPPT) with Iron: An ATR/FT-IR and XPS Investigation," *The Journal of Physical Chemistry C* 115, 1339-1354 (2011).
Miglio et al., Silicides—Fundamentals and Applications (World Scientific Publishing, 2000).
Paul, Ian. (Apr. 3, 2013). "The end of Moore's Law is on the horizon, says AMD" PC World (Accessed on May 4, 2016).
Poate et al., "Kinetics and mechanism of platinum silicide formation on silicon," *Applied Physics Letters* 24(8), 391-393 (1974).
Price Water House Coopers Strategy&: The Global Innovation 1000: Top 20 R&D Spenders 2005-2013 (Accessed on May 4, 2016).
Rhoderick et al., Metal-Semiconductor Contacts (Clarendon Press, 1988).
Rowe, Thermoelectrics Handbook: Macro to Nano. (Taylor & Francis Group, 2006).
Schmitt et al., "Synthesis and Applications of metal silicide nanowires," *Journal of Materials Chemistry* 20, 223-235 (2010).
Stark et al., "Deriving the kinetic parameters for Pt-silicide formation from temperature ramped in situ ellipsometric measurements," *Thin Solid Films* 358, 73-79 (2000).
Streller et al., "Tunable, Source-Controlled Formation of Platinum Silicides and Nanogaps from Thin Precursor Films," *Advanced Materials Interfaces* 1, 1300120 (2014).
Tanuma, S., "Surface Analysis by Auger and X-Ray Photoelectron Spectroscopy," Surf. Interface Anal. 2004; 36: 1647 (IM Publications, 2003).
Tichelaar et al., "Structure of twin boundaries in L12 ordered alloys," *Philosophical Magazine A* 54(2), L55-L60 (1986).
Tichelaar et al., "TEM determination of incoherent twin-boundary structure in L12 ordered alloys," *Le Journal de Physique Colloques* 49, 293-298 (1988).
Tu et al., "Low Schottky barrier of rare-earth silicide on n-Si," *Applied Physics Letters* 38(8), 626-628 (1981).
Vobecky et al., "Reliability of Contacts for Press-Pack High-Power Devices," Microelectronics Reliability 45:1676-1681 (2005).

* cited by examiner

102 — Provide a substrate

104 — Deposit Film Layers

106 — Anneal Film Layers

Figure 1

*Cross-sectional view:*

Fig. 8A
Fig. 8B
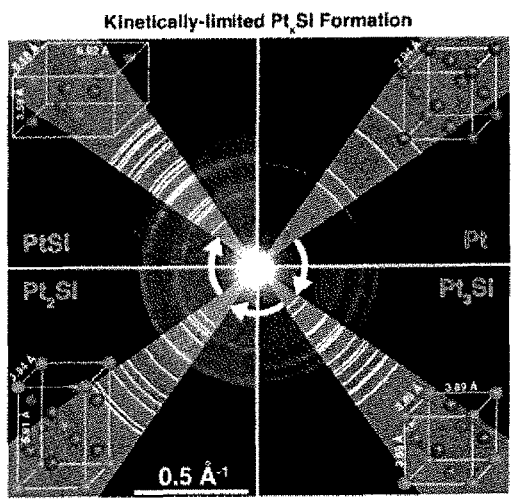
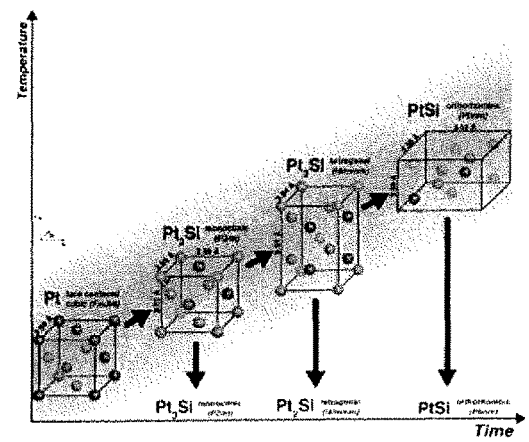

THIN FILM METAL SILICIDES AND METHODS FOR FORMATION

CROSS REFERENCE TO RELATED APPLICATIONS

This application claims priority to U.S. Provisional Application No. 62/112,579, filed on Feb. 5, 2015, the entire contents of which are incorporated herein by reference.

STATEMENT REGARDING FEDERALLY SPONSORED RESEARCH

This invention was made with government support under grant number CCMI1334241awarded by the National Science Foundation. The government has certain rights in the invention.

BACKGROUND

Solid-state reactions to form metal silicides ($Me_xSi$) can be used to form ohmic contacts, Schottky barrier contacts, gate electrodes, local interconnects, and diffusion barriers in the microelectronics industry. Certain metal silicides, i.e., platinum silicides ($Pt_xSi$), can demonstrate certain characteristics useful for contacts for nanoelectromechanical (NEM) switches. For example, platinum silicides can demonstrate wear and oxidation resistance during nanoscale mechanical contact.

Certain $Pt_xSi$ can be formed from thin film Pt deposited on a single crystal Si (sc-Si) wafer using a two part process. First, Pt atoms diffuse into the sc-Si and a Pt-rich silicide, $Pt_2Si$, is formed. After the Pt is consumed, atoms from the sc-Si can diffuse into $Pt_2Si$ to form the thermodynamically stable PtSi phase. However, certain NEM switch geometries can demand silicidation away from the sc-Si carrier wafer, leading to an incompatibility of the sc-Si/Pt silicidation process with such NEM switch geometries.

SUMMARY

The disclosed subject matter provides thin films including a metal silicide and methods for forming such films. In example embodiments, the disclosed subject matter provides methods which include providing a substrate, depositing at least two film layers on the substrate which include a first layer including amorphous silicon and a second layer including metal contacting the first layer, and annealing the two film layers to form a metal silicide. The method can be at least one of a source-limited method and a kinetically-limited method. The film layers can be deposited on the substrate using any thin film deposition technique known in the art including, for example, sputter depositing. The film layers can be deposited on the substrate by first depositing the first layer and subsequently depositing the second layer on top of the first layer.

In certain embodiments, the substrate can include silicon. A diffusion barrier can be deposited between the substrate and the at least two thin film layers. The diffusion barrier can include at least one of aluminum nitride and silicon nitride. The metal can include at least one of platinum, titanium, nickel, tungsten, cobalt, molybdenum, and chromium. The metal silicide can be a platinum silicide. For example, the metal silicide can include $Pt_3Si$. The platinum silicide can be at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, at least about 74% $Pt_3Si$, at least about 75% $Pt_3Si$, at least about 80% $Pt_3Si$, at least about 85% $Pt_3Si$, and at least about 88% $Pt_3Si$.

In another example embodiment, the disclosed subject matter provides a source-limited method for forming a thin film including a metal silicide. The method can include identifying a desired phase of a metal silicide, determining a ratio of an amount of a metal to an amount of amorphous silicon based on the desired phase of the metal silicide, providing a substrate, depositing at least two film layers on the substrate including a first layer of amorphous silicon and a second metal layer contacting the first layer, the at least two film layers including the amorphous silicon and the metal in amounts based on the determined ratio, and annealing the at least two film layers to form the desired phase of the metal silicide. The ratio can be determined, for example, by experimentally determining the ratio or calculating the ratio.

In accordance with embodiments of the disclosed subject matter, the substrate can include a wafer. A diffusion barrier can be deposited between the substrate and the at least two thin film layers. The diffusion barrier can include at least one of aluminum nitride and silicon nitride. The metal can include at least one of platinum, titanium, nickel, tungsten, cobalt, molybdenum, and chromium. In accordance with an exemplary embodiment of the disclosed subject matter, the metal silicide can be a platinum silicide.

The disclosed subject matter also provides kinetically-limited methods for forming a thin film. In one example, the method includes identifying a desired phase of a metal silicide, determining a time-temperature regime based on the desired phase, providing a substrate, depositing at least two film layers on the substrate, the at least two film layers including a first layer including amorphous silicon and a second layer including metal contacting the first layer, and annealing the at least two film layers using the determined time-temperature regime to form the desired phase of the metal silicide. The time-temperature can be determined, for example, by experimentally determining the time-temperature regime.

In accordance with yet another aspect, the disclosed subject matter provides a thin film including a metal silicide. In accordance with one embodiment, a thin film is formed by a process including providing a substrate, depositing at least two film layers on the substrate, the at least two film layers including a first layer including amorphous silicon and a second layer including metal contacting the first layer, and annealing the at least two film layers to form a metal silicide.

In accordance with another embodiment, a thin film is formed by a process including identifying a desired phase of a metal silicide, determining a ratio of an amount of a metal to an amount of amorphous silicon based on the desired phase of the metal silicide, providing a substrate, depositing at least two film layers on the substrate, the at least two film layers comprising a first layer including amorphous silicon and a second layer including metal contacting the first layer, the at least two film layers including the amorphous silicon and the metal in amounts based on the determined ratio, and annealing the at least two film layers to form the desired phase of the metal silicide.

In accordance with a further embodiment, a thin film is formed by a process including identifying a desired phase of a metal silicide, determining a time-temperature regime based on the desired phase, providing a substrate, depositing at least two film layers on the substrate, the at least two film layers including a first layer including amorphous silicon and a second layer including metal contacting the first layer, and annealing the at least two film layers using the determined time-temperature regime to form the desired phase of the metal silicide.

In a further aspect, the disclosed subject matter provides a thin film including $Pt_3Si$. The thin film can be at least 40% $Pt_3Si$, at least 45% $Pt_3Si$, at least 50% $Pt_3Si$, at least 55% $Pt_3Si$, at least 60% $Pt_3Si$, at least 65% $Pt_3Si$, at least 70% $Pt_3Si$, at least 74% $Pt_3Si$, at least about 75% $Pt_3Si$, at least about 80% $Pt_3Si$, at least about 85% $Pt_3Si$, and at least about 88% $Pt_3Si$.

In another aspect, the disclosed subject matter provides systems and devices including thin films in accordance with the disclosed subject matter. The device can be, for example, a nanoeletromechanical switch, a jet engine, a plasmonic device, a battery such as a lithium-ion battery, or a field emitter.

In yet another aspect, the disclosed subject matter provides a method for forming a thin film including a metal silicide. The method can include providing a first layer of amorphous silicon and a second layer of mater, and diffusing the amorphous silicon into the metal. The diffusing can include annealing the first layer of amorphous silicon and the second layer of metal to diffuse the amorphous silicon into the metal.

BRIEF DESCRIPTION OF THE DRAWINGS

FIG. 1 illustrates an exemplary embodiment of a method for forming a thin film comprising a metal silicide in accordance with the disclosed subject matter.

FIG. 6A shows electron diffraction patterns of as-deposited Pt, and $Pt_3Si$, $Pt_2Si$, and PtSi films produced using a source-limited solid-state diffusion approach in accordance with an exemplary embodiment of the disclosed subject matter. Gray slices indicates the theoretical diffraction ring positions according to the theoretical crystal structure schematically shown for each phase. FIG. 6B shows a conceptual schematic of the source-limited solid-state diffusion process in accordance with an exemplary embodiment of the disclosed subject matter, which utilizes precise control of the Pt and a-Si precursor film thickness to predetermine the desired $Pt_xSi$ phase.

FIG. 7A shows the high-resolution XPS spectra of the Pt4f peaks of the PtSi-rich sample (Pt:a-Si=1:3). Quantitative analysis of the XPS results indicated the formation of 92% of PtSi. FIG. 7B shows the high-resolution XPS spectra of the Pt4f peaks of the $Pt_2Si$-rich sample (Pt:a-Si=1:1). Quantitative analysis of the XPS results indicated the formation of 90% of $Pt_2Si$. FIG. 7C shows the high-resolution XPS spectra of the Pt4f peaks of the $Pt_3Si$-rich sample (Pt:a-Si=1:2). Quantitative analysis of the XPS results indicated the formation of 74% of $Pt_3Si$. FIG. 7D shows the high-resolution XPS spectra of the Pt4f peaks of the as-deposited sample Quantitative analysis of the XPS results indicates the presence of pure metallic Pt.

FIG. 8A and FIG. 8B illustrates kinetically-limited formation of $Pt_xSi$ in accordance with an exemplary embodiment of the disclosed subject matter. FIG. 8A shows electron diffraction patterns of as-deposited Pt and $Pt_3Si$, $Pt_2Si$, and PtSi films produced using a kinetically-limited solid-state diffusion approach in accordance with an exemplary embodiment of the disclosed subject matter. Gray slices indicates the theoretical diffraction ring positions according to the theoretical crystal structure schematically shown for each phase. FIG. 8B shows a conceptual schematic of the kinetically-limited solid-state diffusion process in accordance with an exemplary embodiment of the disclosed subject matter, which utilizes precise control of the temperature-time regime to obtain the desired $Pt_xSi$ phase.

FIG. 9A shows the high-resolution X-ray photoelectron spectroscopy (XPS) spectra of the Pt4f peaks of the PtSi-rich sample. Quantitative analysis of the XPS results indicated the formation of 91% of PtSi. FIG. 9B shows the high-resolution XPS spectra of the Pt4f peaks of the $Pt_2Si$-rich sample. Quantitative analysis of the XPS results indicated the formation of 72% of $Pt_2Si$. FIG. 9C shows the high-resolution XPS spectra of the Pt4f peaks of the $Pt_3Si$-rich sample. Quantitative analysis of the XPS results indicated the formation of 88% of $Pt_3Si$. FIG. 9D shows the high-resolution XPS spectra of the Pt4f peaks of the as-deposited sample Quantitative analysis of the XPS results indicates the presence of pure metallic Pt.

FIG. 10A shows a schematic of an as-deposited sample composed of an a-Si film covered by Pt nanoparticles in accordance with an exemplary embodiment of the disclosed subject matter, along with a TEM image. FIG. 10A further shows the differences depending on whether Pt or Si is the DDS. FIG. 10B shows TEM images before (at 130° C.) and after (280° C.) $Pt_3Si$ formation. The overall shape and size of the Pt and $Pt_3Si$ nanoparticles is similar and indicates that $Pt_3Si$ formation occurs through diffusion of a-Si into Pt. The electron diffraction pattern shows that $Pt_xSi$ particles were formed.

DETAILED DESCRIPTION

In accordance with one aspect of the disclosed subject matter, a method for forming a thin film comprising a metal silicide is provided. The method can include providing a substrate, depositing at least two thin film layers on the substrate, the at least two film layers comprising a first layer comprising amorphous silicon and a second layer comprising metal contacting the first layer, and annealing the at least two film layers to form a metal silicide. In accordance with embodiments of the disclosed subject matter, the method can be, for example, a source-limited method or a kinetically-limited method.

Figure 2A:
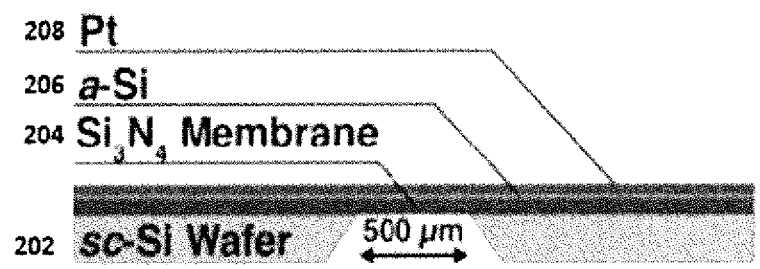
FIG. 2A illustrates a cross-sectional view of an as-deposited sample using an exemplary embodiment of a method for forming a thin film comprising a metal silicide in accordance with the disclosed subject matter.
Figure 2B:
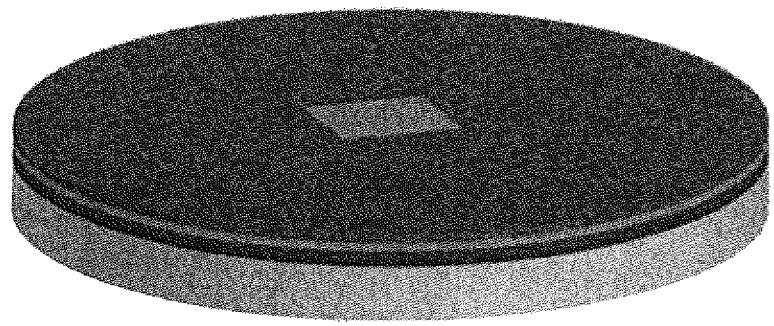
FIG. 2B illustrates a perspective view of an as-deposited sample using an exemplary embodiment of a method for forming a thin film comprising a metal silicide in accordance with the disclosed subject matter.

An exemplary embodiment of a method for forming a thin film comprising a metal silicide in accordance with the disclosed subject matter is shown in FIG. 1. A substrate can be provided at 102. The substrate can be any object, regardless of the shape, that be coated in a conformal manner with at least two film layers. The substrate can be, for example, a wafer such as a silicon wafer. For example, FIG. 2A shows a cross-section view of a sample formed in accordance with an exemplary embodiment of the disclosed subject matter. The substrate 202 in FIG. 2A is a single crystal silicon wafer. In accordance with other embodiments of the disclosed subject matter, the substrate can be a cylinder-shaped object. The materials used for the substrate can be chosen as appropriate for the individual process. For example, the materials for the substrate can be chosen such that they will not melt or sublimate at the annealing temperature, which can vary based on the deposited film layers. The materials can also be chosen such that they will be non-reactive to the buffer layer at the annealing temperature.

In accordance with embodiments of the disclosed subject matter, a diffusion buffer 204 can be deposited on the substrate 202. The diffusion buffer 204 can act to prevent diffusion of the metal and/or silicon into the substrate during annealing. The diffusion buffer 204 can be, for example, a layer of silicon nitride ($Si_3N_4$), a layer of silicon oxide, a layer of non-porous aluminum oxide ($Al_2O_3$), or a layer of aluminum nitride (AlN). In accordance with other embodiments, the buffer can be any material that does not react with the metal or amorphous silicon at the annealing temperature. The diffusion buffer 204 can be sputter deposited on the substrate 202.

With further reference to FIG. 1, at least two film layers can be deposited on the substrate at 104. The at least two film layers can include a first layer comprising amorphous silicon and a second layer comprising metal. The first layer can be in contact with the second layer 208. For example, and as shown in FIG. 2A, the first layer 206 comprising amorphous silicon can be deposited onto the substrate 202. The first layer 206 can be deposited directly onto the substrate 202, or may be deposited onto the substrate via one or more intermediate layers such as diffusion buffer 204. The second layer 208 can then be deposited onto the first layer 206. The first and second layers 206 and 208 can be deposited via sputter depositing, atomic layer deposition, thermal evaporation, chemical vapor deposition, molecular beam epitaxy, or other thin film depositions techniques as known in the art.

In accordance with certain embodiments of the disclosed subject matter, a third film layer comprising silicon can be deposited onto the second layer 208. In accordance with other embodiments, additional alternating layers of amorphous silicon and metal can be deposited. Diffusion can occur more uniformly from both directions with such arrangements.

The second layer 208 can be a layer of platinum. In accordance with other embodiments, the second layer 208 can include at least one of titanium, nickel, tungsten, cobalt, molybdenum, and chromium.

Figure 3A:
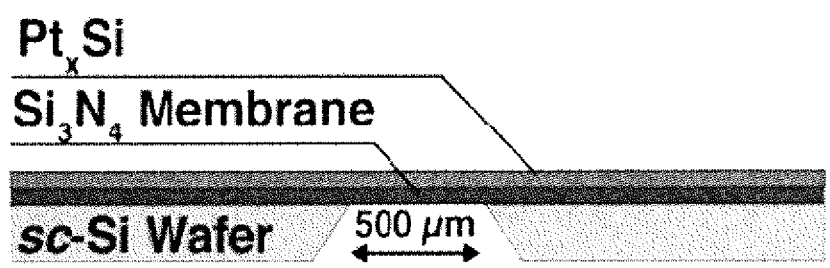
FIG. 3A illustrates a cross-sectional view of an annealed sample using an exemplary embodiment of a method for forming a thin film comprising a metal silicide in accordance with the disclosed subject matter.
Figure 3B:
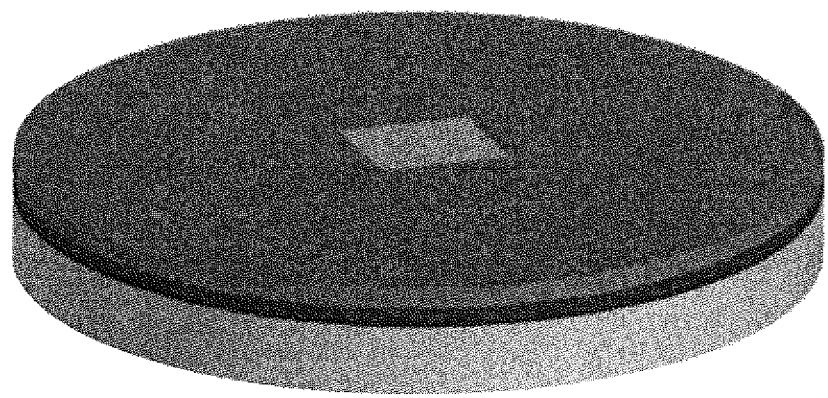
FIG. 3B illustrates a perspective view of an annealed sample using an exemplary embodiment of a method for forming a thin film comprising a metal silicide in accordance with the disclosed subject matter.

With further reference to FIG. 1, the at least two layers can be annealed at 106. A cross-section view of a thin film including metal silicide in accordance with an exemplary embodiment of the disclosed subject matter is shown in FIG. 3A. The thin film in FIG. 3A is the result of annealing the sample of FIG. 2A. The metal silicide layer 306 can be platinum silicide. For example, the metal silicide layer can include $Pt_3Si$. In accordance with embodiments of the disclosed subject matter, the metal silicide layer can include at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, at least about 74% $Pt_3Si$, at least about 75% $Pt_3Si$, at least about 80% $Pt_3Si$, at least about 85% $Pt_3Si$, or at least about 88% $Pt_3Si$. For example, the metal silicide layer can include between about 50% and about 60%, between about 55% and about 65%, between about 60% and about 70%, between about 65% and about 74%, between about 40% and about 74%, between about 50% and about 65%, between about 50% and about 74%, between about 60% and about 74%, between about 70% and about 74% $Pt_3Si$, between about 50% $Pt_3Si$ and about 88% $Pt_3Si$, between about 60% $Pt_3Si$ and about 85% $Pt_3Si$, between about 70% $Pt_3Si$ and about 80% $Pt_3Si$, between about 70% $Pt_3Si$ to about 85% $Pt_3Si$, between about 75% $Pt_3Si$ to about 88% $Pt_3Si$, or between about 80% $Pt_3Si$ and about 88% $Pt_3Si$.

In accordance with embodiments of the disclosed subject matter, the method can further include using at least one of a source-limited method and a kinetically-limited method to tune a selected phase of the metal silicide.

Figure 4:
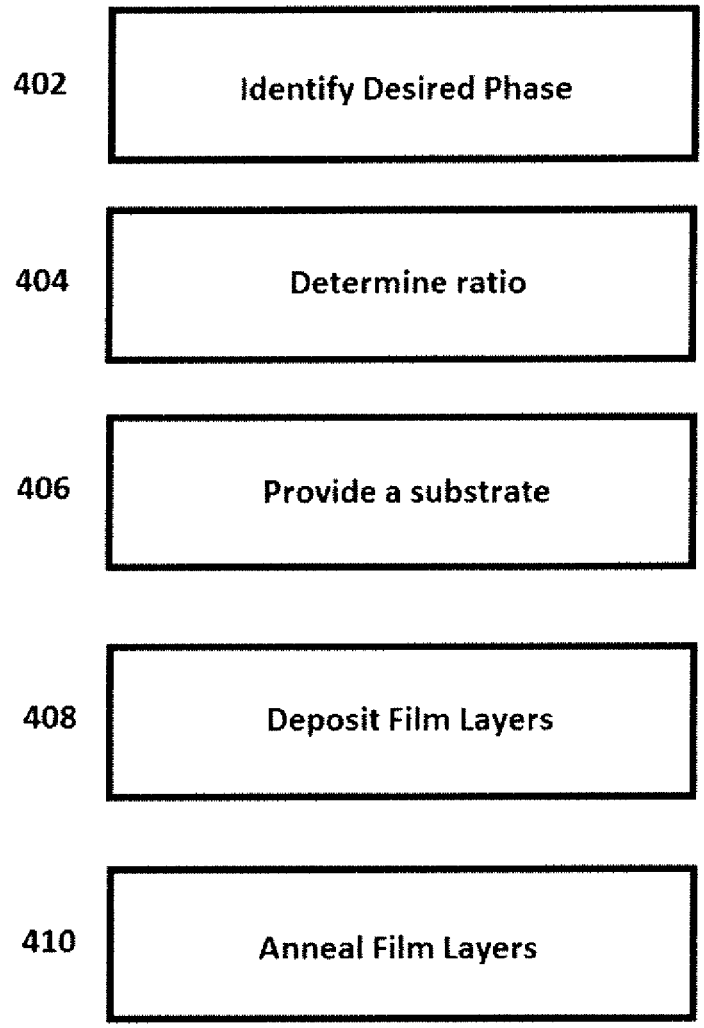
FIG. 4 illustrates an exemplary embodiment of a source-limited method for forming a thin film comprising a metal silicide in accordance with the disclosed subject matter.

An exemplary embodiment of a source-limited method for forming a thin film comprising a metal silicide is shown in FIG. 4. A desired phase of a metal silicide can be selected at 402. The desired phase of platinum silicide can be, for example, PtSi, $Pt_2Si$, or $Pt_3Si$. The desired phase of the metal silicide can be selected depending on the needs for a particular application.

A ratio of an amount of metal to an amount of amorphous silicon can then be determined based on the desired phase at 404. Source-limited methods can use the relative amounts of the starting materials (e.g., by precisely controlling the precursor thin film layer thicknesses) to predetermine the achievable silicide stoichiometry after annealing. For example, a ratio of about 1:3 Pt:a-Si can be used to form PtSi, about 1:1 can be used to form $Pt_2Si$, and about 1:2 can be used to form $Pt_3Si$. The ratio can be determined experimentally such as by trial and error until a desired ratio is identified. Alternatively, the ratio can be calculated, e.g., by comparing the effective amount of moles of metal (e.g., Pt) and Si based on their respective densities. In accordance with another embodiment, the ratio can be obtained from a third party.

A substrate can be provided at 406. The substrate can be a silicon wafer. At least two film layers can be deposited on the substrate at 408. The at least two thin film layers can be deposited directly onto the substrate, or can be deposited on the substrate via one or more intermediate layers such as a diffusion barrier. The at least two film layers include at least a first layer comprising amorphous silicon and a second layer comprising metal. The metal can be, for example, platinum, titanium, nickel, tungsten, cobalt, molybdenum, or chromium.

The at least two film layers include amorphous silicon and metal in amounts based on the selected ratio. For example, if the ratio is 1:1, amorphous silicon and metal can be deposited on the substrate in equal amounts. In accordance with one embodiment of the disclosed subject matter, the thickness of the layers deposited onto the substrate can be varied to match the desired ratio. For example, if the selected ratio is 1:1, a layer of amorphous silicon having a thickness of 100 nm can be deposited on the substrate, and a layer of metal having a thickness of 100 nm can be deposited onto the layer of amorphous silicon.

The at least two film layers can then be annealed to form the desired phase of the metal silicide at 410. The metal silicide can be, for example, platinum silicide, titanium silicide, nickel silicide, tungsten silicide, cobalt silicide, molybdenum silicide, or chromium silicide. The desired phase of platinum silicide can be, for example, PtSi, $Pt_2Si$, or $Pt_3Si$. In accordance with embodiments of the disclosed subject matter, the metal silicide layer can include at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, or at least about 74% $Pt_3Si$. For example, the metal silicide layer can include between about 50% and about 60%, between about 55% and about 65%, between about 60% and about 70%, between about 65% and about 74%, between about 40% and about 74%, between about 50% and about 65%, between about 50% and about 74%, between about 60% and about 74%, or between about 70% and about 74% $Pt_3Si$.

Figure 5:
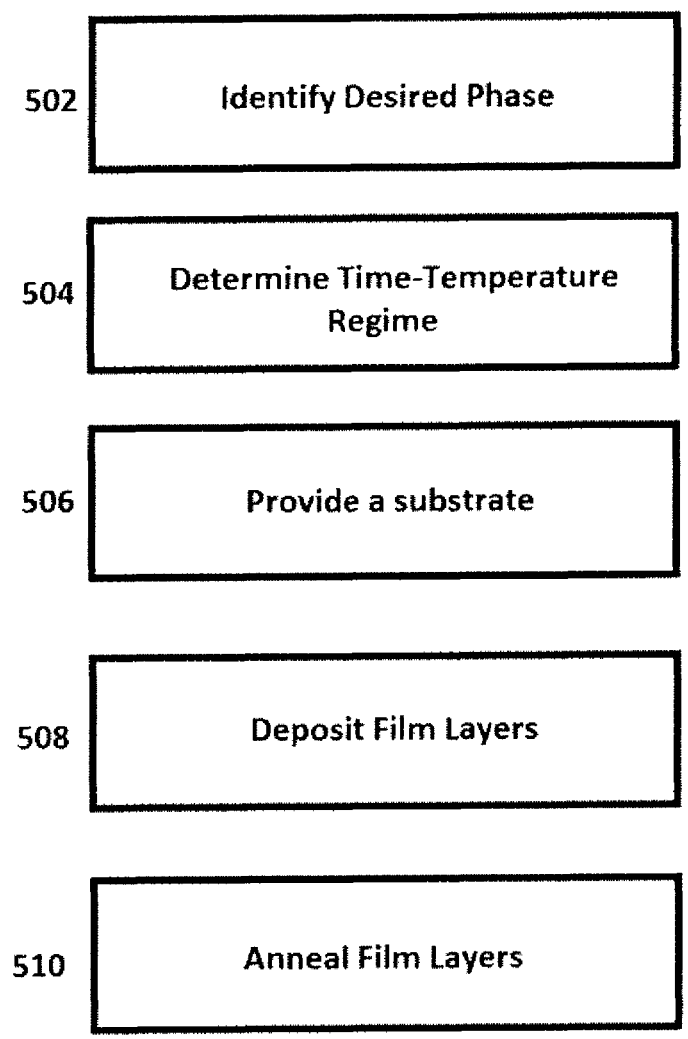
FIG. 5 illustrates an exemplary embodiment of a kinetically-limited method for forming a thin film comprising a metal silicide in accordance with the disclosed subject matter.

An exemplary embodiment of a kinetically-limited method for forming a thin film comprising a metal silicide is shown in FIG. 5. A desired phase of a metal silicide can be selected at 502. The desired phase of platinum silicide can be, for example, PtSi, $Pt_2Si$, or $Pt_3Si$. The desired phase of the metal silicide can be selected depending on the needs for a particular application.

A time-temperature regime can then be determined based on the desired phase at 504. Kinetically-limited methods can use the annealing process (e.g., by precisely controlling the time-temperature regime) to obtain a desired stoichiometry and phase. For example, a sample including a layer of amorphous silicon and a layer of platinum can be heated at a first temperature to obtain $Pt_3Si$, at a second temperature higher than the first temperature to obtain $Pt_2Si$, or at a third temperature higher than the second temperature to obtain PtSi. For example, the first temperature can be approximately 200° C., the second temperature can be approximately 300° C., and the third temperature can be approximately 500° C. The time for which the sample is heated at the appropriate temperature can also be varied. The time-temperature regime can be determined experimentally such as by trial and error until a desired time-temperature ratio is identified. Alternatively, the time-temperature regime can be calculated or obtained from a third party.

A substrate can be provided at 506. The substrate can be a silicon wafer. At least two film layers can be deposited on the substrate at 508. The at least two thin film layers can be deposited directly onto the substrate, or can be deposited on the substrate via one or more intermediate layers such as a diffusion barrier. The at least two film layers include at least a first layer comprising amorphous silicon and a second layer comprising metal. The metal can be, for example, platinum, titanium, nickel, tungsten, cobalt, molybdenum, or chromium.

The at least two film layers can then be annealed to form the desired phase of the metal silicide at 510. The two film layers can be annealed using the determined time-temperature regime to form the desired phase of the metal silicide.

The metal silicide can be, for example, platinum silicide, titanium silicide, nickel silicide, tungsten silicide, cobalt silicide, molybdenum silicide, or chromium silicide. The desired phase of platinum silicide can be, for example, PtSi, $Pt_2Si$, or $Pt_3Si$. In accordance with embodiments of the disclosed subject matter, the metal silicide layer can include at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, at least about 75% $Pt_3Si$, at least about 80% $Pt_3Si$, at least about 85% $Pt_3Si$, or at least about 88% $Pt_3Si$. For example, the metal silicide layer can include between about 50% and about 60%, between about 55% and about 65%, between about 60% and about 70%, between about 65% and about 75%, between about 40% and about 75%, between about 50% and about 65%, between about 50% and about 75%, between about 60% and about 75%, between about 70% and about 75% $Pt_3Si$, between about 50% $Pt_3Si$ and about 88% $Pt_3Si$, between about 60% $Pt_3Si$ and about 85% $Pt_3Si$, between about 70% $Pt_3Si$ and about 80% $Pt_3Si$, between about 70% $Pt_3Si$ to about 85% $Pt_3Si$, between about 75% $Pt_3Si$ to about 88% $Pt_3Si$, or between about 80% $Pt_3Si$ and about 88% $Pt_3Si$.

In accordance with another aspect, the disclosed subject matter provides a thin film comprising metal silicide. In accordance with one embodiment, the disclosed subject matter provides a thin film comprising metal silicide formed by a process including providing a substrate, depositing at least two thin film layers on the substrate, the at least two thin film layer comprising a first layer comprising amorphous silicon and a second layer comprising metal contacting the first layer, and annealing the at least two thin film layers to form a metal silicide.

In accordance with another embodiment, the disclosed subject matter provides a thin film comprising a metal silicide formed by a process including identifying a desired phase of a metal silicide, determining a ratio of an amount of a metal to an amount of amorphous silicon based on the desired phase of the metal silicide, providing a substrate, depositing at least two thin film layers on the substrate, the at least two thin film layers comprising a first layer comprising amorphous silicon and a second layer comprising metal contacting the first layer, the at least two film layers comprising the amorphous silicon and the metal in amounts based on the determined ratio, and annealing the at least two film layers to form the desired phase of the metal silicide.

In accordance with yet another embodiment, the disclosed subject matter provides a thin film comprising a metal silicide formed by a process including identifying a desired phase of a metal silicide, determining a time-temperature regime based on the desired phase, providing a substrate, depositing at least two thin film layers on the substrate, the at least two thin film layers comprising a first layer comprising amorphous silicon and a second layer comprising metal contacting the first layer, and annealing the at least two film layers using the determined time-temperature regime to form the desired phase of the metal silicide.

In accordance with a further embodiment, the disclosed subject matter can provide a thin film comprising a metal silicide formed by a process comprising providing a first layer of amorphous silicon and a second layer of metal, and diffusing the amorphous silicon into the metal. The diffusing can include annealing the first layer of amorphous silicon and the second layer of metal.

Thin films formed according to the above-referenced processes can have higher electrical conductivity than metal silicides formed using single crystal silicon while possessing similar mechanical properties. The thin films can also include anti-phase boundaries. Anti-phase boundaries can hinder dislocation motion and increase the yield strength of the material. In each of the aforementioned thin films, the thin film can comprise at least one of a platinum silicide, a titanium silicide, a nickel silicide, a cobalt silicide, a molybdenum silicide, or a chromium silicide.

In accordance with a further embodiment, the disclosed subject matter can provide a thin film comprising $Pt_3Si$. The thin film can include at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, at least about 74% $Pt_3Si$, at least about 75% $Pt_3Si$, at least about 80% $Pt_3Si$, at least about 85% $Pt_3Si$, or at least about 88% $Pt_3Si$. For example, the metal silicide layer can include between about 50% and about 60%, between about 55% and about 65%, between about 60% and about 70%, between about 65% and about 74%, between about 40% and about 74%, between about 50% and about 65%, between about 50% and about 74%, between about 60% and about 74%, between about 70% and about 74% $Pt_3Si$, between about 50% $Pt_3Si$ and about 88% $Pt_3Si$, between about 60% $Pt_3Si$ and about 85% $Pt_3Si$, between about 70% $Pt_3Si$ and about 80% $Pt_3Si$, between about 70% $Pt_3Si$ to about 85% $Pt_3Si$, between about 75% $Pt_3Si$ to about 88% $Pt_3Si$, or between about 80% $Pt_3Si$ and about 88% $Pt_3Si$.

Thin films comprising metal silicides can be used in a wide variety of applications. For example, the thin films can be used as contact materials for nanoelectromechanical switches. The thin films can also be used in jet engines, plasmonic devices, lithium-ion batteries, field-emitters, and atomic force microscopy probes.

EXAMPLES

The Pt and a-Si films were sputter deposited in a Denton Vacuum Explorer 14 sputterer (Denton Vacuum Inc, Moorestown, N.J.) with a purity of 99.99% for both films. Pt was deposited in DC mode at 450 W and a-Si in AC mode at 230 W. The Pt nanoparticles were produced by coating an a-Si film with approx. 10 nm of Pt, which does not wet the surface completely, forming nanoparticles instead of a continuous film.

An in situ heating TEM sample holder (Gatan Inc., Pleasanton, Calif.) was used to form $Pt_xSi$ inside the TEM. The heating holder is equipped with a thermocouple sensitive to ±1° C. All source-controlled solid-state diffusion samples were subject to a similar annealing treatment which included the heating up to 500° C. (30° C./min) and holding at 500° C. for 10 min. This was followed by heating up to 600° C. (30° C./min), holding at 600° C. for 10 min and rapid cooling to 50° C. (85° C./min). The kinetically-limited solid-state diffusion sample was heated up under 30° C./min until 200° C. and rapidly quenched to conserve the $Pt_3Si$ phase. Subsequently, the sample was heated up to 300° C. (30° C./min) to form $Pt_2Si$ followed by rapid quenching. Finally, the sample was heated up to 500° C. (30° C./min) to form PtSi and subsequently cooled down.

All TEM experiments were performed using a JEOL 2100 thermionic emission source TEM (JEOL Ltd., Tokyo, Japan). An accelerating voltage of 200 kV was used with a beam current of 106 μA resulting in a current density of 275 pA/cm².

The chemistry of the near-surface region was investigated by X-ray photoelectron spectroscopy (XPS) using a customized XPS spectrometer (VG Scienta AB, Uppsala, Sweden) 17. XPS analyses were performed using a monochromatic Al Kα source (photon energy: 1486.6 eV). The residual pressure in the analysis chamber was constantly less than $1 \cdot 10^{-8}$ Torr. The spectrometer was calibrated according to ISO 15472:2001 with an accuracy of ±0.05 eV. Survey and high resolution spectra were acquired in constant-analyzer-energy mode with the pass energies of 200 eV and 100 eV, respectively. The full width at half-maximum (FWHM) of the peak-height for the high-resolution $Ag\ 3d_{5/2}$ signal of a sputter-cleaned Ag sample was 0.57 eV. The spectra were processed using CasaXPS software (v.2.3.16, Case Software Ltd., Wilmslow, Cheshire, U.K.). Background subtraction was performed using the Shirley-Sherwood method. The quantitative evaluation of XPS data was based on integrated intensity using a first-principles model and applying Powell's equation. The inelastic mean free path was calculated using the TPP-2M formula. Curve synthesis for the Pt 4f peaks was performed constraining the integrated intensity ratio of these two signals to 3:4 and their energy separation to 3.33 eV. The reference energies for Pt 4f7/2 peaks are 71.05 eV, 71.55 eV, 72.18 eV, and 72.75 eV for Pt, $Pt_3Si$, $Pt_2Si$, and PtSi respectively.

Samples of varying Pt:a-Si film thickness ratios were fabricated to form $Pt_xSi$ films of varying stoichiometry using the source-limited solid-state diffusion approach and to assess their crystal structures and formation sequence. To achieve this, PELCO 50 nm silicon nitride ($Si_3N_4$) support TEM grids (Ted Pella Inc., Redding, Calif.) were sputter-coated with thin layers of a-Si and Pt, whose thicknesses were optimized to obtain nearly pure phases of $Pt_3Si$, $Pt_2Si$ and PtSi upon annealing. The Pt and a-Si depositions were conducted sequentially in the same deposition system under maintained vacuum. This procedure minimizes contaminant adsorption between the layers and the oxidation of the a-Si—both inhibiting factors for silicidation. The Pt/a-Si coated $Si_3N_4$-support TEM grids were then removed from the deposition system and subsequently characterized using TEM (JOEL 2100 TEM, JEOL Ltd., Tokyo, Japan). An in situ heating TEM sample holder (Gatan Inc., Pleasanton, Calif.) was used to anneal the samples inside the TEM while continuously recording the electron diffraction pattern, which allowed the formation sequence of the different $Pt_xSi$ phases to be determined. All samples were subjected to similar annealing treatments that included a 10 min hold at 500° C. followed by a 10 min hold at 600° C. High resolution electron diffraction studies of the as deposited and annealed samples allowed the determination of PtxSi crystal structure.

Figure 6B:
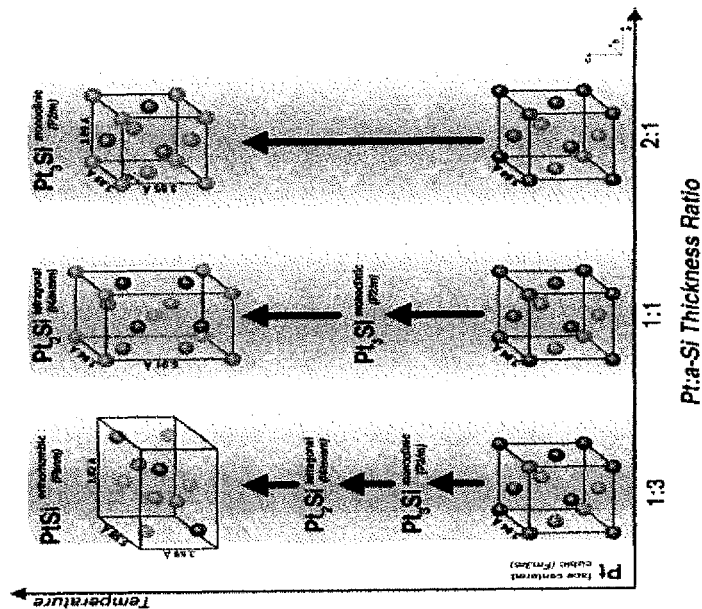
FIG. 6A and FIG. 6B illustrates source-limited formation of $Pt_xSi$ in accordance with an exemplary embodiment of the disclosed subject matter.
Figure 6A:
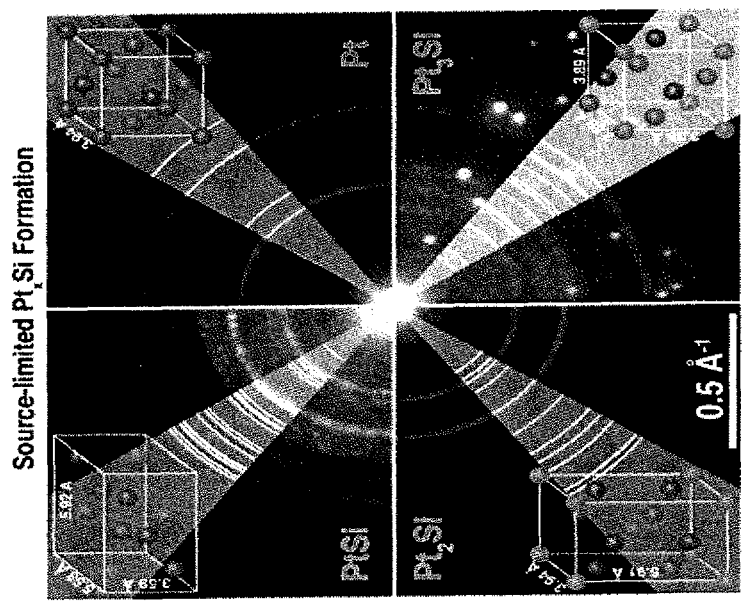

The results from the source-limited solid-state diffusion experiments are shown in FIG. 6. The Pt:a-Si film thickness ratios were chosen to be 1:3 (Pt:a-Si=1:3) to form PtSi, 1:1 (Pt:a-Si=1:1) for $Pt_2Si$, and 2:1 (Pt:a-Si=2:1) for $Pt_3Si$. FIG. 6a shows high-resolution electron diffraction patterns of one of the as-deposited Pt/a-Si samples (similar patterns were obtained for all as-deposited Pt/a-Si samples) and the formed Pt$_x$Si films. The diffraction pattern of the as deposited Pt/a-Si film (top-right quadrant in FIG. 6a) matches the theoretical pattern for Pt, as the amorphous structure of the a-Si film and Si$_3$Ni$_4$ membrane do not produce any diffraction rings. All theoretical diffraction patterns have been calculated using the theoretical crystal structures of Pt and PtxSi phases and CrystalMaker software (CrystalMaker Software Ltd., Oxfordshire, United Kingdom). The diffraction rings shown in the bottom-right quadrant in FIG. 6a match the theoretical diffraction spots for monoclinic Pt$_3$Si, which demonstrates that the Pt:a-Si=2:1 sample led to the formation of Pt$_3$Si upon annealing. The bottom-left quadrant in FIG. 6a shows the diffraction pattern of the Pt:a-Si=1:1 sample upon annealing, which matches the theoretical diffraction pattern for tetragonal Pt$_2$Si. The top-left quadrant in FIG. 6a shows the diffraction pattern that was obtained after annealing the Pt:a-Si=1:3 sample. The diffraction rings match with the theoretical diffraction pattern of orthorhombic PtSi. FIG. 6b summarizes the formation process of the Pt$_3$Si, Pt$_2$Si and PtSi films. The formation process of all three Pt$_x$Si stoichiometries starts with the formation of the Pt$_3$Si phase. This is the only phase that was observed for the Pt:a-Si=2:1 sample and was stable throughout the complete annealing procedure. However, considerable grain-growth occurred as a result of the low Pt$_3$Si formation temperature of 200° C. and the continued heat treatment up to 600° C. The grain growth results in the appearance of high-intensity diffraction spots in the bottom-right quadrant of FIG. 6a. The Pt$_2$Si formation followed the Pt$_3$Si formation at approximately 300-325° C. for the Pt:a-Si=1:1 and Pt:a-Si=1:3 samples. This phase remained stable for the Pt:a-Si=1:1 sample, whereas PtSi was formed around 400-425° C. in the Pt:a-Si=1:3 sample.

Figure 7A:
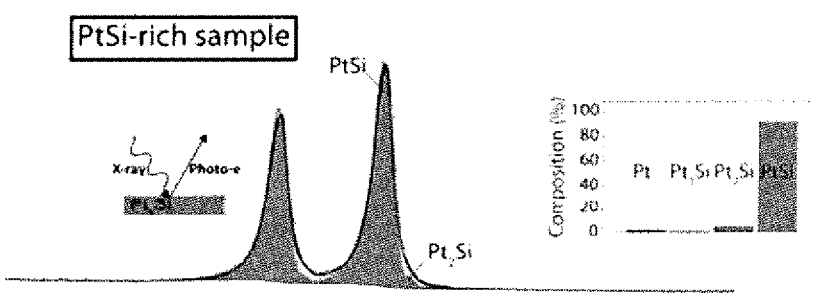
FIG. 7A-FIG. 7D shows surface characterization of as-deposited Pt and formed $Pt_xSi$ on TEM grids using source-limited solid-state diffusion in accordance with an exemplary embodiment of the disclosed subject matter.
Figure 7B:
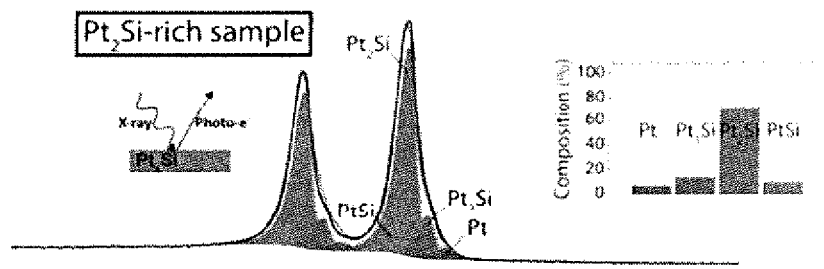
Figure 7C:
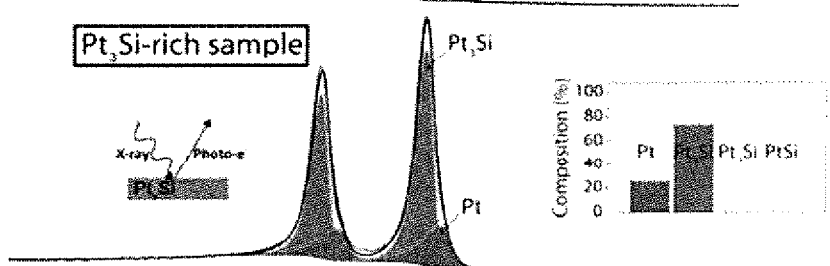
Figure 7D:
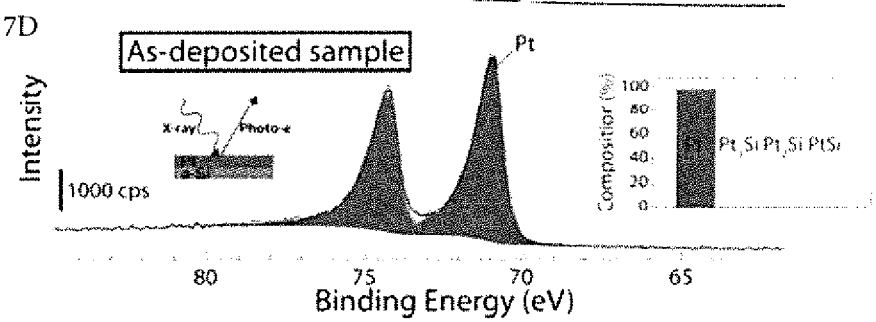
Figure 9A:
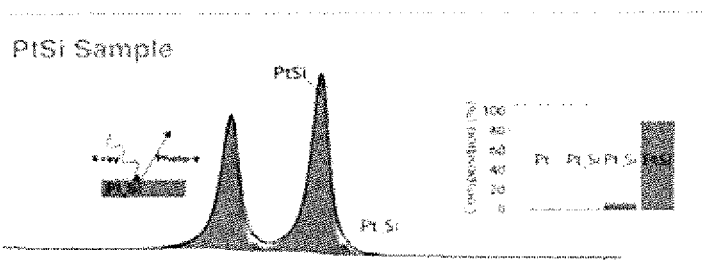
FIG. 9A-FIG. 9D shows surface characterization of as-deposited Pt and formed $Pt_xSi$ on TEM grids using kinetically-limited solid-state diffusion in accordance with an exemplary embodiment of the disclosed subject matter.
Figure 9B:
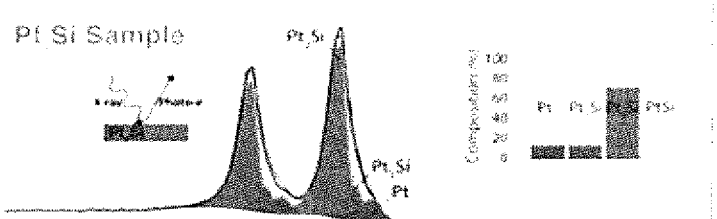
Figure 9C:
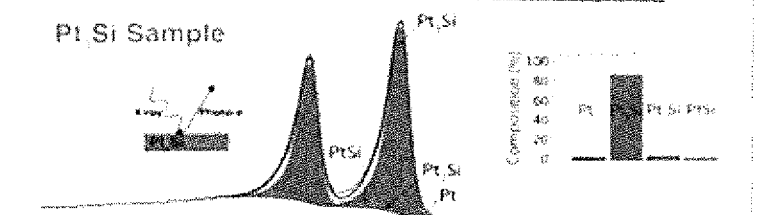
Figure 9D:
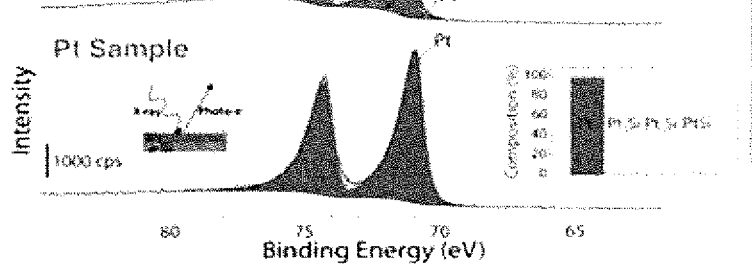

The annealed TEM grids were additionally characterized using high-resolution angle resolved X-ray photoelectron spectroscopy (XPS) to determine the stoichiometry of the as deposited Pt and the formed Pt$_x$Si phases. The surface characterization of as-deposited PT and formed Pt$_3$Si on TEM rides using source-limited solid state diffusion is shown in FIG. 7. The high-resolution XPS spectra of as-deposited Pt is displayed in FIG. 7d. The Pt4f$_{7/2}$ peak position (71.05 eV) and lineshape are characteristic for metallic platinum, thus confirming the TEM diffraction pattern displayed in FIG. 6a (top right quadrant). FIG. 7c shows the high-resolution XPS spectra of the annealed Pt:a-Si=2:1 sample, which displayed Pt$_3$Si-like diffraction behavior in FIG. 6a (bottom-right quadrant). Quantitative analysis (reported in the insets in FIG. 7) determined that this sample consists of 74% Pt$_3$Si and 26% metallic Pt. FIG. 7b shows the high-resolution XPS spectra of the annealed Pt:a-Si=1:1 sample, which displayed Pt$_2$Si-like diffraction behavior in FIG. 6a (bottom-left quadrant). Quantitative XPS analysis showed that this sample consists of 70% Pt$_2$Si phase, while the remaining 30% are a mixture between metallic Pt, Pt$_3$Si and PtSi (7% Pt, 14% Pt$_3$Si, 9% PtSi). The high-resolution XPS spectra of the annealed Pt:a-Si=1:3 sample is displayed in FIG. 7a. This sample is composed of 92% PtSi phase (remainder: 2% Pt, 1% Pt$_3$Si, 5% Pt$_2$Si), which matches well with the PtSi diffraction pattern this sample exhibited in FIG. 6a (left-top quadrant). The quantitative XPS analysis confirmed the Pt$_x$Si stoichiometries that have been determined using in situ TEM electron diffraction. The overall results obtained from in situ TEM and XPS experiments on samples of different Pt:a-Si film thickness ratios confirm that the stoichiometry of Pt$_x$Si thin films can be precisely tuned using source-controlled solid-state diffusion.

Samples of Pt:a-Si thickness ratio of 1:3 were produced to test if the precise control of the temperature-time regime during silicidation can be used to tune the Pt$_x$Si stoichiometry (i.e. kinetically-limited solid-state diffusion). This Pt:a-Si thickness ratio will ultimately lead to PtSi formation, while passing the Pt$_3$Si and Pt$_2$Si stoichiometries (as seen in FIG. 6b). FIG. 8 summarizes the results from the kinetically-limited solid-state diffusion experiments. FIG. 8a shows high-resolution electron diffraction images recorded at room temperature and after the annealing process has been halted at specific temperatures to produce highly selective Pt$_x$Si phases. The as-deposited sample, which exhibited a Pt electron diffraction pattern (see top-tight quadrant in FIG. 8a), was heated up to 200° C. to form Pt$_3$Si and then quickly cooled down to retain this phase at room temperature (see bottom-right quadrant in FIG. 8a). The Pt$_3$Si film was subsequently heated up to 300° C. to form Pt$_2$Si and quickly cooled down to retain this phase at room temperature (see bottom-left quadrant in FIG. 8a). Finally, the formed Pt$_2$Si film was heated up to 500° C. so that PtSi is formed and subsequently cooled down (see top-left quadrant in FIG. 8a). Comparison of the kinetically-limited diffraction patterns (FIG. 8a) with those from the source-limited experiments (FIG. 6a) show that the peak positions and intensity ratios are very similar which indicates a similar composition of the Pt$_x$Si phases for kinetically-limited and source-limited experiments (see FIG. 11). FIG. 8a also shows that all formed phases exhibit minimal grain growth. Dark-field TEM results also indicated that the formed Pt$_x$Si films are nanocrystaline. FIG. 8b summarizes the kinetically-limited Pt$_x$Si formation experiments and shows that the stoichiometry of Pt$_x$Si films was precisely tunable by controlling the temperature-time regime during the annealing. The in situ TEM experiments presented in FIG. 8 prove that kinetically-controlled solid-state diffusion is a powerful way to tune the Pt$_x$Si stoichiometry.

The surface characterization of as-deposited Pt and formed Pt$_3$Si on TEM rides using source-limited solid state diffusion is shown in FIG. 9. The high-resolution XPS spectra of as-deposited Pt is displayed in FIG. 9d. FIG. 9c shows the high-resolution XPS spectra of the sample after annealing at 200° C. Quantitative analysis (reported in the insets in FIG. 9) determined that this sample consists of 88% Pt$_3$Si. FIG. 9b shows the high-resolution XPS spectra of the sample after annealing at 300° C. Quantitative XPS analysis showed that this sample consists of 72% Pt$_2$Si phase. The high-resolution XPS spectra of the sample after annealing at 500° C. is displayed in FIG. 9a. This sample is composed of 91% PtSi phase.

Figure 10A:
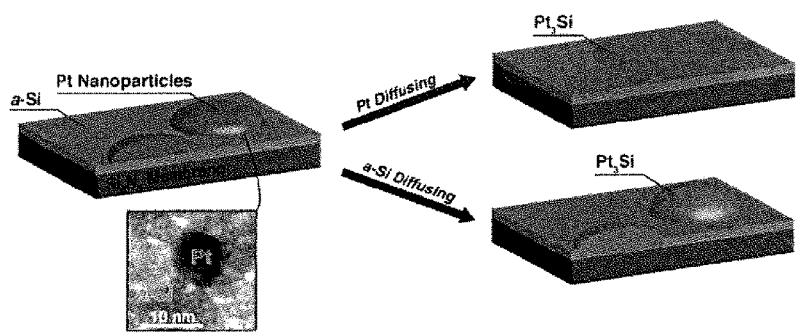
FIG. 10A and FIG. 10B illustrates the determination of the dominant diffusion species (DDS) during $Pt_3Si$ formation in accordance with an exemplary embodiment of the disclosed subject matter.
Figure 10B:
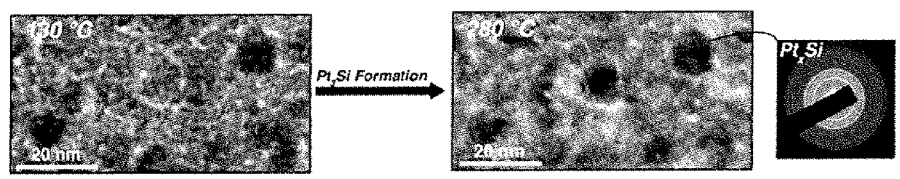

Both source-limited and kinetically-limited solid-state diffusion experiments (FIG. 6, FIG. 8) were able to produce highly selective Pt$_3$Si films, which have not been experimentally reported before or observed during Pt/sc-Si experiments. The well-studied Pt/sc-Si system is characterized by the specific Pt$_x$Si formation sequence of Pt diffusing into sc-Si around 250-300° C. to form the intermediate Pt$_2$Si phase. After all Pt is consumed, sc-Si will diffuse into Pt$_2$Si at 300-450° C. to form the thermodynamically stable PtSi phase. The amorphous nature of the a-Si film used in accordance with exemplary embodiments of the disclosed subject matter alters the diffusion behavior compared to sc-Si, which leads to the formation of the Pt$_3$Si phase. Without wishing to be bound to any particular theory, it is believed that the Pt$_3$Si phase is formed due to the fact that in the Pt/a-Si system, a-Si acts initially as the dominant diffusing species (DDS) in contrast to the Pt/sc-Si system where Pt is initially the DDS. The larger "free space" in a-Si compared to sc-Si leads to reduced activation energies for a-Si self-diffusion of up to 27% compared to those for sc-Si. This means that a-Si becomes mobile at lower temperatures than sc-Si. In addition to the increased mobility of a-Si, the Pt diffusivity is drastically reduced in a-Si compared to sc-Si. Pt has a diffusion coefficient at 500° C. of ~$5 \cdot 10^{-18}$ m²/S in a-Si, whereas the diffusion coefficient of Pt in sc-Si is ~$5 \cdot 10^{-16}$ m²/s, which means that Pt diffuses 2 orders of magnitude faster in sc-Si than in a-Si. Both, the increased a-Si and reduced Pt diffusivity contribute to the a-Si diffusion into Pt and subsequent formation of $Pt_3Si$ for the Pt/a-Si system. The observed $Pt_3Si$ formation can also be understood by the high degree of resemblance between the Pt and $Pt_3Si$ crystal structures, including the lattice parameter. The $Pt_3Si$ unit cell can be imagined as a Pt unit cell with the corner atoms replaced by Si. The ease of transformation between Pt and $Pt_3Si$ without the need of massive atomic restructuring is thought to be the reason for such low temperature metamorphosis. To demonstrate that a-Si is the diffusing species instead of Pt and that this diffusion leads to the formation of $Pt_3Si$, we coated a $Si_3N_4$-support TEM grid with a-Si and, subsequently, with Pt nanoparticles of ~10 nm diameter (as shown in FIG. 10a). FIG. 10a shows a schematic and TEM image of the as-deposited sample together with the theoretical pathways leading to the formation of $Pt_3Si$, i.e., the diffusion of Pt in a-Si or the diffusion of a-Si in Pt. If Pt is the DDS, then the Pt nanoparticles will diffuse into the underlying a-Si layer and a TEM Z-contrast image will show significant broadening of the Pt containing regions. If, on the other hand, a-Si is the diffusing species as proposed here, then the general shape of the Pt nanoparticles should be conserved during $Pt_3Si$ formation as only a small amount of a-Si is diffusing into the nanoparticles. FIG. 10b shows an area of the sample with several Pt nanoparticles before (at 130° C.) and after (at 280° C.) $Pt_3Si$ formation. The overall shape and size of the nanoparticles do not undergo any significant changes due to $Pt_3Si$ formation. This result confirms that a-Si is the DDS, and that it diffuses into Pt to form $Pt_3Si$, which means that the occurrence for $Pt_3Si$ in a-Si-based silicidation experiments is entirely due to the high diffusivity of a-Si, and that such films are not attainable using sc-Si.

Figure 11:
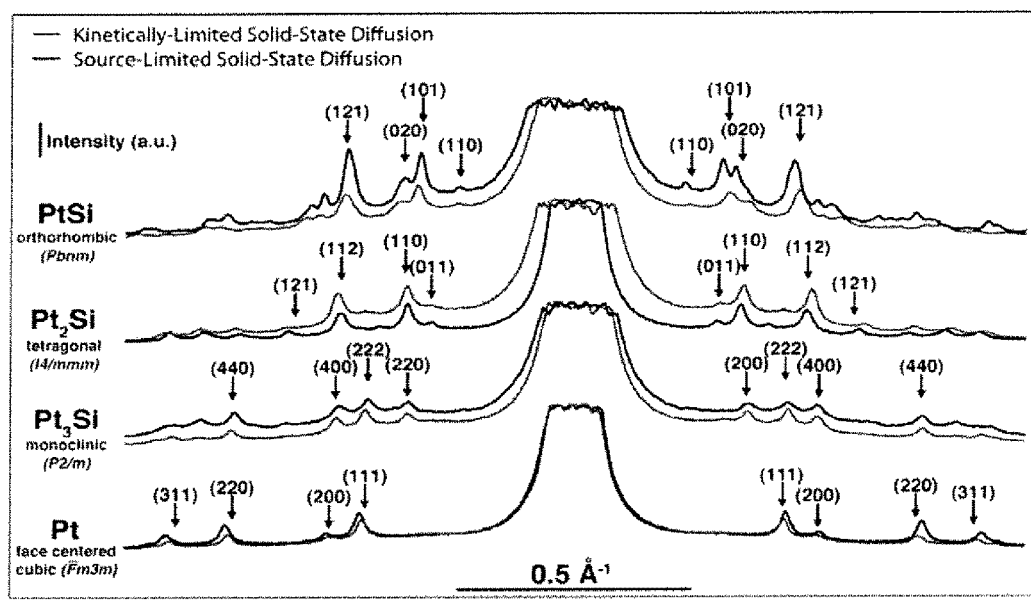
FIG. 11 shows a comparison of diffraction pattern intensity distributions obtained from kinetically-limited and source-limited solid-state diffusion samples in accordance with an exemplary embodiment of the disclosed subject matter.

A comparison of diffraction pattern intensity distributions obtained from the kinetically-limited and source-limited solid-state diffusion samples is shown in FIG. 11. The peak locations and intensity ratios are similar for both methods and indicate that the kinetically-limited samples possess similar compositions as the source-limited samples. The theoretical peaks positions of the strongest peaks are indicated by the downward arrows.

Figure 12:
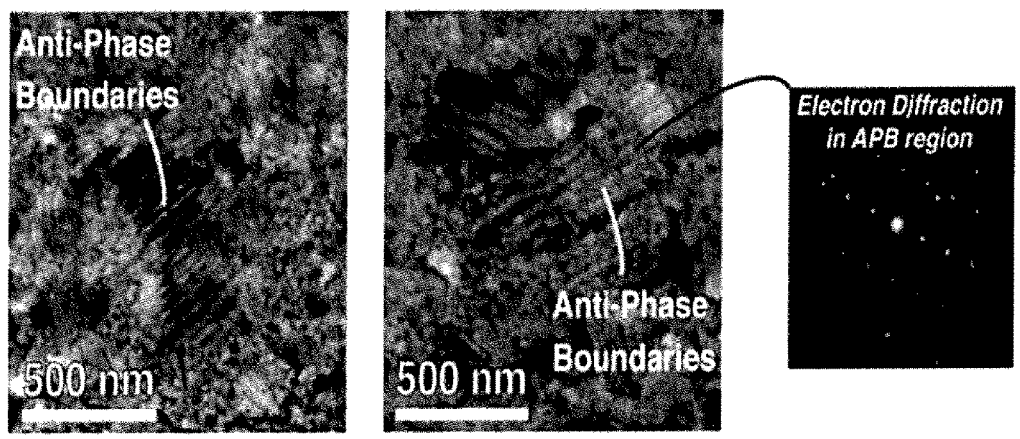
FIG. 12 shows TEM images of anti-phase boundaries (APBs) formed in $Pt_3Si$ in accordance with an exemplary embodiment of the disclosed subject matter. Electron diffraction images of APB show single-crystal diffraction spots.

The $Pt_3Si$ films resulting from Pt/a-Si annealing have several intriguing advantages over PtSi films that result from Pt/sc-Si. Most notably, $Pt_3Si$ possesses similar mechanical properties as PtSi (~50% greater hardness and modulus compared to Pt), while possessing a higher electrical conductivity. The increase in hardness in $Pt_3Si$ can also be understood from our source-limited heating experiments where we observe not only grain coarsening but also formation of anti-phase boundaries (APBs) which are two dimensional defects commonly found in L12 type crystal structures. TEM images of the APBs formed in Pt3Si are shown in FIG. 12. These APBs will hinder dislocation motion and thereby plastic deformation.

Figure 13:
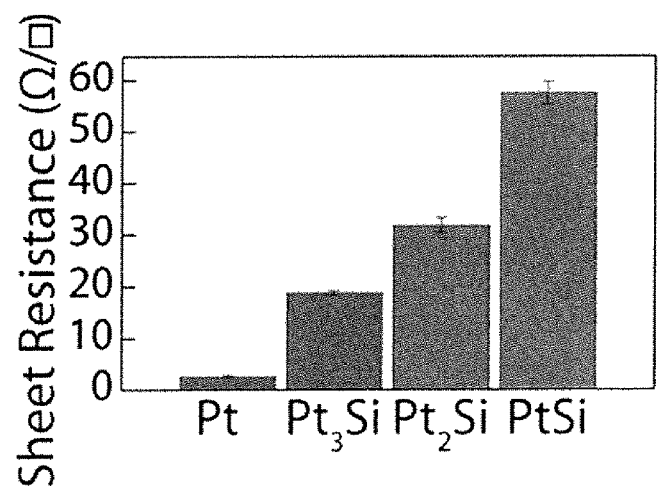
FIG. 13 shows a comparison of sheet resistance measurements taken from Pt, $Pt_3Si$, and $Pt_2Si$ samples fabricated in accordance with an exemplary embodiment of the disclosed subject matter.

Measurements taken from XPS experiments on $Pt_xSi$ thin film samples fabricated according to an exemplary embodiment of the herein disclosed methods were used to determine the density of states (DOS) at the Fermi Level, as shown below in Table 1. The measurements demonstrate that the herein disclosed methods can be employed to tailor the electronic structure of metal thin films towards specific applications, such as, for example and without limitation, high conductive applications. A comparison of sheet resistance (Ω/square) determined from measurements taken in XPS experiments on $Pt_xSi$ thin film samples produced by one embodiment of the herein disclosed subject matter is shown in FIG. 13 to further demonstrate that the electronic structure of metal thin films can be tailored to produce desirable properties, such as, for example, high conductivity. With reference to the example of FIG. 13, sheet resistance, or in-plan electrical resistance, is inversely correlated with electrical conductivity, such that a low sheet resistance reflects a correspondingly high electrical conductivity. The measurements of FIG. 13 illustrate a relatively low sheet resistance associated with the $Pt_3Si$ phase as compared to the PtSi phase, indicating high conductivity, which is confirmed in the XPS measurements of Table 1, below. Accordingly, the $Pt_xSi$ thin film phases fabricated using the herein disclosed methods provide advantages over the conventional PtSi thin film phase, which suffers from low conductivity due to its having a low DOS at the Fermi Level, as shown by way of example in Table 1 and in relation to its sheet resistance depicted in FIG. 13.

TABLE 1

| Normalized Carrier Density | |
|---|---|
| | XPS |
| Pt | 1 |
| $Pt_3Si$ | 0.59 |
| $Pt_2Si$ | 0.20 |
| PtSi | 0.17 |

The measurements illustrated in FIG. 13 further demonstrate that the $Pt_xSi$ thin film phases fabricated using the herein disclosed methods are superior to conventional PtSi thin films introduced with dopants. For example, in certain applications where PtSi is a desired material, such as in the semiconductor industry for contacting the source, drain, and/or gate to CMOS field effect transistors, conventional techniques to increase the DOS can include introducing dopants into the PtSi thin film. These dopants can include, for example, titanium or other metals. Although the addition of titanium to PtSi was found in prior experiments to increase the DOS from about 17% of the DOS of Pt to about 30% of the DOS of Pt, the titanium impurities decreased the carrier mobility of the thin film, thereby lowering its conductivity. Thus, the $Pt_xSi$ phases produced from the techniques herein disclosed, and particularly the $Pt_3Si$ phase, have advantages over conventional metal thin films and methods of formation and can be used in applications that require high electrical conductivity, such as for example, in semiconductor technologies.

The presently disclosed subject matter is not to be limited in scope by the specific embodiments herein. Indeed, various modifications of the disclosed subject matter in addition to those described herein will become apparent to those skilled in the art from the foregoing description and the accompanying figures.

The invention claimed is:

1. A method for forming a thin film comprising a metal silicide, comprising:
    providing a substrate;

depositing at least two film layers on the substrate, the at least two film layers comprising a first layer comprising amorphous silicon and a second layer comprising metal contacting the first layer;

annealing the at least two film layers to form a metal silicide; and tuning a selected phase of the metal silicide using at least one of a source-limited method and a kinetically-limited method.

2. The method of claim 1, wherein the substrate comprises silicon.

3. The method of claim 1, further comprising depositing a diffusion barrier between the substrate and the at least two film layers.

4. The method of claim 3, wherein the diffusion barrier comprises at least one of aluminum nitride and silicon nitride.

5. The method of claim 1, wherein depositing comprises first depositing the first layer and subsequently depositing the second layer on top of the first layer.

6. The method of claim 1, wherein depositing comprises sputter depositing.

7. The method of claim 1, wherein the metal comprises platinum.

8. The method of claim 1, wherein the metal comprises at least one of titanium, nickel, tungsten, cobalt, molybdenum, and chromium.

9. The method of claim 1, wherein the metal silicide comprises platinum silicide.

10. The method of claim 9, wherein the platinum silicide comprises $Pt_3Si$.

11. The method of claim 10, wherein the platinum silicide is selected from a group consisting of at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, at least about 74% $Pt_3Si$, at least about 75% $Pt_3Si$, at least about 80% $Pt_3Si$, at least about 85% $Pt_3Si$, and at least about 88% $Pt_3Si$.

12. A source-limited method for forming a thin film comprising a metal silicide, comprising:

identifying a desired phase of a metal silicide;

determining a ratio of an amount of a metal to an amount of amorphous silicon based on the desired phase of the metal silicide;

providing a substrate;

depositing at least two film layers on the substrate, the at least two film layers comprising a first layer comprising amorphous silicon and a second layer comprising metal contacting the first layer, the at least two film layers comprising the amorphous silicon and the metal in amounts based on the determined ratio; and annealing the at least two film layers to form the desired phase of the metal silicide.

13. The method of claim 12, wherein the determining comprises experimentally determining the ratio.

14. The method of claim 12, wherein the determining comprises calculating the ratio.

15. The method of claim 12, wherein the substrate comprises a wafer.

16. The method of claim 12, further comprising depositing a diffusion barrier between the substrate and the at least two film layers.

17. The method of claim 12, wherein the metal comprises platinum.

18. The method of claim 12, wherein the metal comprises at least one of titanium, nickel, tungsten, cobalt, molybdenum, and chromium.

19. The method of claim 12, wherein the metal silicide comprises platinum silicide.

20. The method of claim 19, wherein the desired phase of the platinum silicide comprises $Pt_3Si$.

21. The method of claim 20, wherein the platinum silicide is selected from a group consisting of at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, and at least about 74% $Pt_3Si$.

22. A kinetically-limited method for forming a thin film comprising a metal silicide, comprising:

identifying a desired phase of a metal silicide;

determining a time-temperature regime based on the desired phase;

providing a substrate;

depositing at least two film layers on the substrate, the at least two film layers comprising a first layer comprising amorphous silicon and a second layer comprising metal contacting the first layer; and annealing the at least two film layers using the determined time-temperature regime to form the desired phase of the metal silicide.

23. The method of claim 22, wherein the determining comprises experimentally determining the time-temperature regime.

24. The method of claim 22, wherein the substrate comprises a wafer.

25. The method of claim 22, further comprising depositing a diffusion barrier between the substrate and the at least two film layers.

26. The method of claim 22, wherein the metal comprises platinum.

27. The method of claim 22, wherein the metal comprises at least one of titanium, nickel, tungsten, cobalt, molybdenum, and chromium.

28. The method of claim 22, wherein the metal silicide comprises platinum silicide.

29. The method of claim 28, wherein the desired phase of the platinum silicide comprises $Pt_3Si$.

30. The method of claim 29, wherein the platinum silicide is selected from a group consisting of at least about 40% $Pt_3Si$, at least about 45% $Pt_3Si$, at least about 50% $Pt_3Si$, at least about 55% $Pt_3Si$, at least about 60% $Pt_3Si$, at least about 65% $Pt_3Si$, at least about 70% $Pt_3Si$, at least about 75% $Pt_3Si$, at least about 80% $Pt_3Si$, at least about 85% $Pt_3Si$, and at least about 88% $Pt_3$ Si.

31. A thin film comprising a metal silicide formed by a process comprising:

providing a substrate;

depositing at least two film layers on the substrate, the at least two film layers comprising a first layer comprising amorphous silicon and a second layer comprising metal contacting the first layer; and annealing the at least two film layers to form a metal silicide;

tuning a selected phase of the metal silicide using at least one of a source-limited method and a kinetically-limited method.

32. A thin film comprising a metal silicide formed by a process comprising:

identifying a desired phase of a metal silicide;

determining a ratio of an amount of a metal to an amount of amorphous silicon based on the desired phase of the metal silicide;

providing a substrate;

depositing at least two film layers on the substrate, the at least two film layers comprising a first layer comprising amorphous silicon and a second layer comprising metal contacting the first layer, the at least two film layers comprising the amorphous silicon and the metal in amounts based on the determined ratio; and annealing the at least two film layers to form the desired phase of the metal silicide.

33. A thin film comprising a metal silicide formed by a process comprising:

identifying a desired phase of a metal silicide;

determining a time-temperature regime based on the desired phase;

providing a substrate;

depositing at least two film layers on the substrate, the at least two film layers comprising a first layer comprising amorphous silicon and a second layer comprising metal contacting the first layer; and annealing the at least two film layers using the determined time-temperature regime to form the desired phase of the metal silicide.

34. A nanoelectromechanical switch comprising the thin film of claims 32.

35. A jet engine comprising the thin film of claim 32.

36. A device comprising the thin film of claim 32, the device selected from a group consisting of a plasmonic device, a lithium-ion battery, a field emitter, and an atomic force microscopy probe.

37. A method for forming a thin film comprising a metal silicide, comprising:

providing a first layer of amorphous silicon and a second layer of metal;

diffusing the amorphous silicon into the metal; and tuning a selected phase of the metal silicide using at least one of a source-limited method and a kinetically-limited method.

38. The method of claim 37, wherein the diffusing comprises annealing the first layer of amorphous silicon and the second layer of metal to diffuse the amorphous silicon into the metal.

* * * * *